United States Patent [19]

Kuo

[11] Patent Number: 5,989,987
[45] Date of Patent: Nov. 23, 1999

[54] METHOD OF FORMING A SELF-ALIGNED CONTACT IN SEMICONDUCTOR FABRICATIONS

[75] Inventor: Ming Cheng Kuo, Hsin-Chuang, Taiwan

[73] Assignee: United Semiconductor Corp., Hsinchu City, Taiwan

[21] Appl. No.: 09/046,059

[22] Filed: Mar. 23, 1998

[30] Foreign Application Priority Data

Nov. 14, 1997 [TW] Taiwan ................................. 86116977

[51] Int. Cl.⁶ ................... H01L 21/3205; H01L 21/4763
[52] U.S. Cl. .......................... 438/592; 438/595; 438/640; 438/666; 438/684; 438/755
[58] Field of Search ..................... 438/592, 640, 438/595, 666, 684, 755

[56] References Cited

U.S. PATENT DOCUMENTS

| 5,510,294 | 4/1996 | Dixit et al. ............................... 437/195 |
| 5,861,673 | 1/1999 | Yoo et al. ................................. 257/758 |

Primary Examiner—John F. Niebling
Assistant Examiner—Alexander G. Ghyka
Attorney, Agent, or Firm—Knobbe, Martens Olson & Bear LLP

[57] ABSTRACT

A method is provided for use in semiconductor fabrications to form a self-aligned contact (SAC) in a semiconductor device, which can help increase the contact area between the metallization layer and the substrate and also prevent the occurrence of a short-circuit between the metallization layer and a conductive layer, such as a tungsten silicide layer, in the gate structures. In particular, the method utilizes an etchant that can etch into the tungsten silicide much more effectively than into the overlying silicon nitride layer and the underlying polysilicon layer. The constricted shape can better prevent the silicide layer from coming into contact, and thus forming a short-circuit, with the subsequently formed metallization layer. Moreover, since the silicide layer is reduced in size due the constriction, the underlying polysilicon layer can be correspondingly made smaller, allowing the contact area between the metallization layer and the substrate to be increased. The increased contact area allows an increase in the RC value of the self-aligned contact.

17 Claims, 4 Drawing Sheets

METHOD OF FORMING A SELF-ALIGNED CONTACT IN SEMICONDUCTOR FABRICATIONS

CROSS-REGERENCE TO RELATED APPLICATION

This application claims the priority benefit of Taiwan application serial no. 86116977, filed Nov. 14, 1997, the full disclosure of which is incorporated herein by reference.

BACKGROUND OF THE INVENTION

1. Field of the Invention

This invention relates to semiconductor fabrication processes, and more particularly, to a method for forming a self-aligned contact (SAC) in a semiconductor device, such as a metal-oxide semiconductor (MOS) device. This method features that it can allow an increase in the area of the resultant self-aligned contact.

2. Description of Related Art

A MOS device is composed of metallization layers, silicon dioxide layers, and substrate. Due to the fact that the adhesion of metal to silicon dioxide is poor, polysilicon is usually used instead of metal to form conductive layers in the gate structure of the MOS device. Although polysilicon-based conductive layers can be doped with impurities to decrease the resistivity thereof, the resultant conductivity is still not adequate enough to serve as good conductive layers in the MOS device. A solution to this problem is to add a layer of metal silicide, such as a layer of tungsten silicide, over the polysilicon layer, whereby the electrical conductivity of the gate structure can be improved.

The method for fabricating a MOS device includes the steps of forming dielectric layers, contact windows, and metallization layers. In the forming of metal contacts between metallization layers and substrate, the self-aligned etching method is the most widely used method. A conventional method for forming a self-aligned contact is illustrated and described in the following with reference to FIGS. 1A through 1C.

Referring to FIG. 1A, in the first step, a substrate 10 is prepared. Subsequently, a plurality of separate gate structures are formed over the substrate 10, each gate structure including a polysilicon layer 11, a layer of tungsten silicide (WSi$_2$) 12, a layer of silicon nitride 13, and a sidewall spacer 14. After the gate structures are formed, a dielectric layer (inter layer dielectrics) 15 is formed over the entire top surface of the wafer, covering all of the exposed surfaces of the gate structures and the substrate 10.

Referring next to FIG. 1B, in the subsequent step, a photolithographic and etching process is performed on the dielectric layer 15 so as to remove a selected portion of the dielectric layer 15 between the gate structures until the top surface of the substrate 10 is exposed. The etching is also effective on the silicon nitride layer 13 but with a slower etching rate, so that the silicon nitride layer 13 and the sidewall spacer 14 will be partly etched away. As a result of this process, an empty space (referred to as a contact window) 16 is formed between the gate structures, which can be self-aligned to the location on the substrate 10 where a contact area is to be formed. As shown, the contact area is to be formed at the exposed surface of the substrate 10 which has a width indicated by X.

Referring further to FIG. 1C, in the subsequent step, a metallization layer 17 is deposited over the entire top surface of the wafer to a specific thickness, covering all of the exposed surfaces of the dielectric layer 15, the sidewall spacers 14 of the gate structures, and the substrate 10. A metal contact having a width X is thus formed between the metallization layer 17 and the substrate 10 in the self-aligned contact window 16.

The RC (resistance-capacitance) value of the foregoing self-aligned contact is proportional to its contact area (i.e., the area indicated by the width X) between the metallization layer 17 and the substrate 10. One method to increase the contact area is to extend the process time of the etching. However, this will also cause the silicon nitride layer 13 to be further etched away, which can, if the process time is not properly controlled, expose the underlying tungsten silicide layer 12. The exposed part of the tungsten silicide layer 12 will then come into contact with the subsequently formed metallization layer 17, resulting in a short-circuit therebetween. The resultant MOS device is therefore a defect one which should be discarded.

SUMMARY OF THE INVENTION

It is therefore an objective of the present invention to provide an improved method for forming a self-aligned contact, which can help increase the contact area between the metallization layer and the substrate so as to increase the RC value of the resultant metal contact.

It is another objective of the present invention to provide an improved method for forming a self-aligned contact, which can help increase the contact area while nevertheless preventing the occurrence of a short-circuit between the metallization layer and the tungsten silicide layer.

In accordance with the foregoing and other objectives of the present invention, an improved method for forming of a self-aligned contact is provided. Broadly speaking, the method according to the invention for forming a self-aligned contact includes the following steps of:

(1) preparing a semiconductor substrate, and then forming at least a pair of separate gate structures over said substrate, each gate structure including a first conductive layer formed on said substrate, a second conductive layer formed on said first conductive layer, and an insulating layer formed on said second conductive layer;

(2) performing an etching process with an etchant that can constrict the second conductive layer with respect to the overlying insulating layer and the underlying first conductive layer;

(3) forming a sidewall spacer on the sidewall of each gate structure;

(4) forming a dielectric layer which covers all of the gate structures;

(5) etching away selected portions of the dielectric layer between the gate structures until the surface of the substrate is exposed so as to form a self-aligned contact window; and (6) forming a metallization layer which covers the exposed surface of the dielectric layer, the sidewall spacers of the gate structures, and the exposed surface of the substrate.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

FIGS. 2A through 2D are schematic sectional diagrams used to depict the steps involved in the method in accordance with the invention for forming a self-aligned contact in a semiconductor device, such as a MOS device.

Figure 1A:
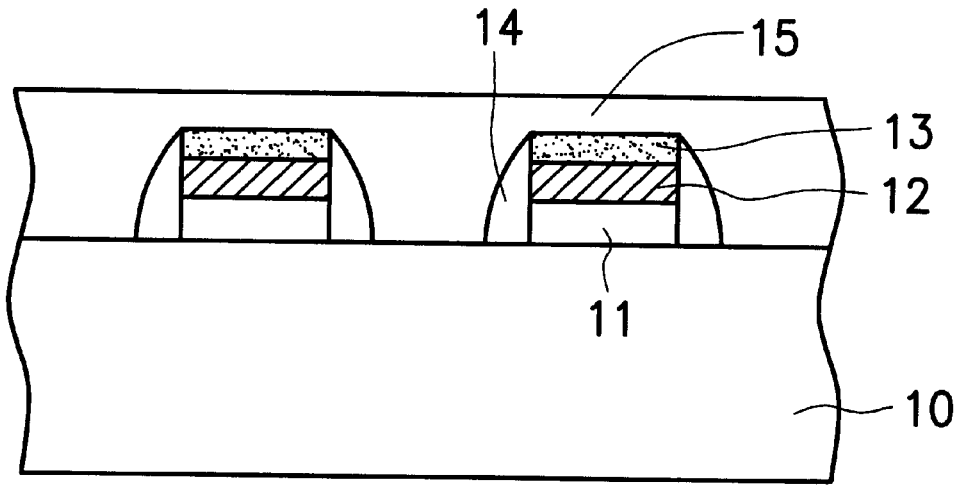
FIGS. 1A through 1C are schematic sectional diagrams used to depict the steps involved in a conventional method for forming a self-aligned contact in a MOS device.
Figure 1B:
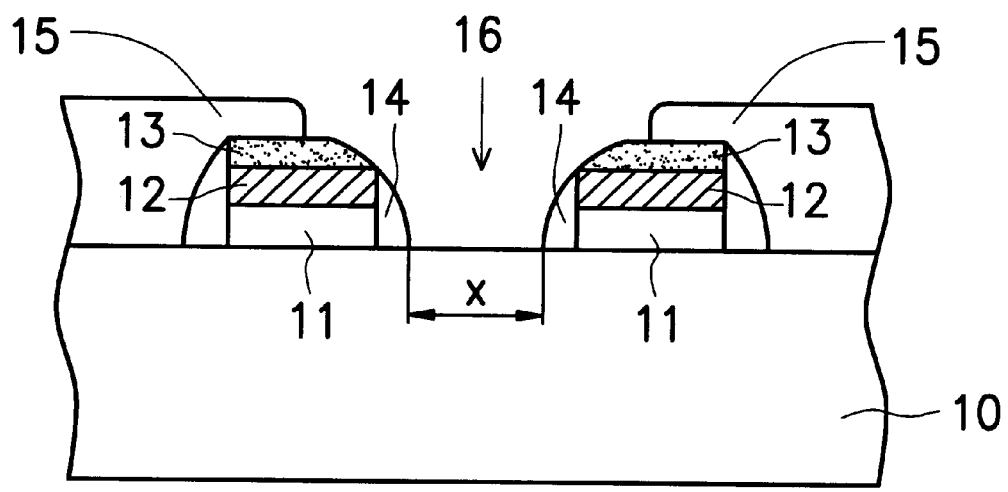
Figure 1C:
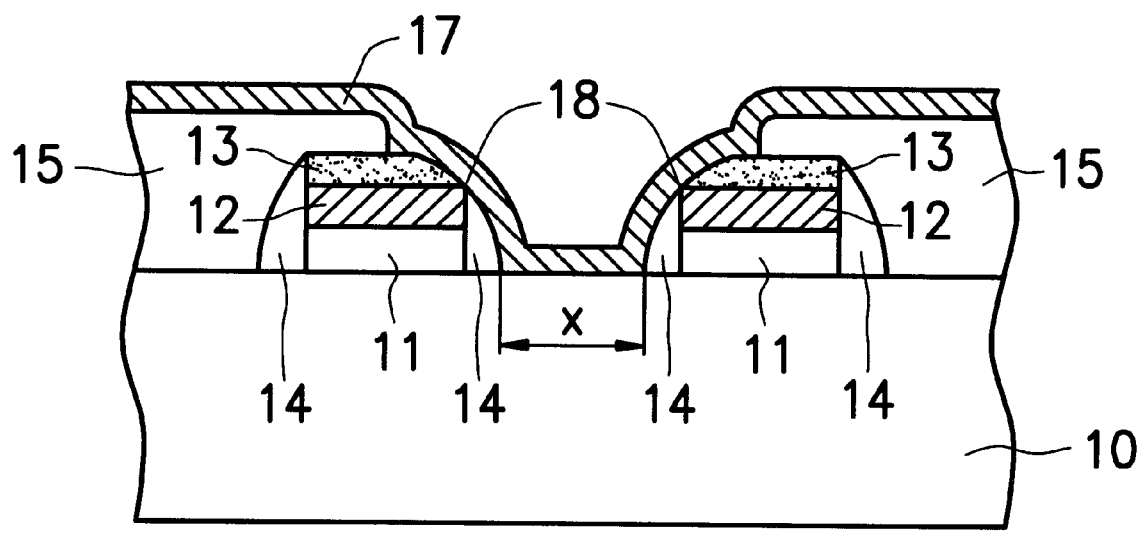
Figure 2A:
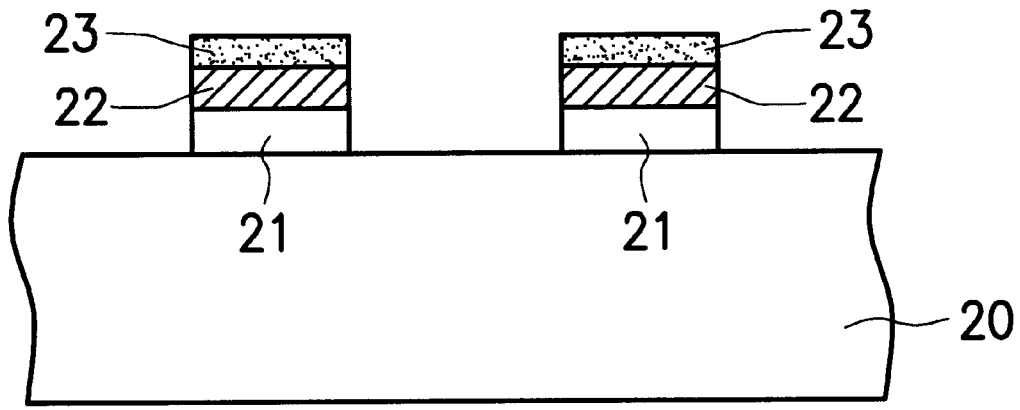
FIGS. 2A through 2D are schematic sectional diagrams used to depict the steps involved in the method of the invention for forming a self-aligned contact in a MOS device.

Referring to FIG. 2A, in the first step, a substrate 20 is prepared. Subsequently, a plurality of separate gate structures are formed over the substrate 20, each gate structure including a first conductive layer, such as a polysilicon layer 21; a second conductive layer, such as a tungsten silicide ($WSi_2$) layer 22, formed over the polysilicon layer 21; and an insulating layer, such as a silicon nitride layer 23, formed over the silicide layer 22. These separate gate structures are formed, for example, by first depositing a layer of polysilicon over the entire top surface of the substrate 20, then depositing a layer of tungsten silicide over the entire top surface of the polysilicon layer, and then depositing a layer of silicon nitride over the entire top surface of the tungsten silicide layer, and finally performing a photolithographic and etching process to remove selected portions of these layers. The remaining portions then serve as the above-mentioned gate structures.

Figure 2B:
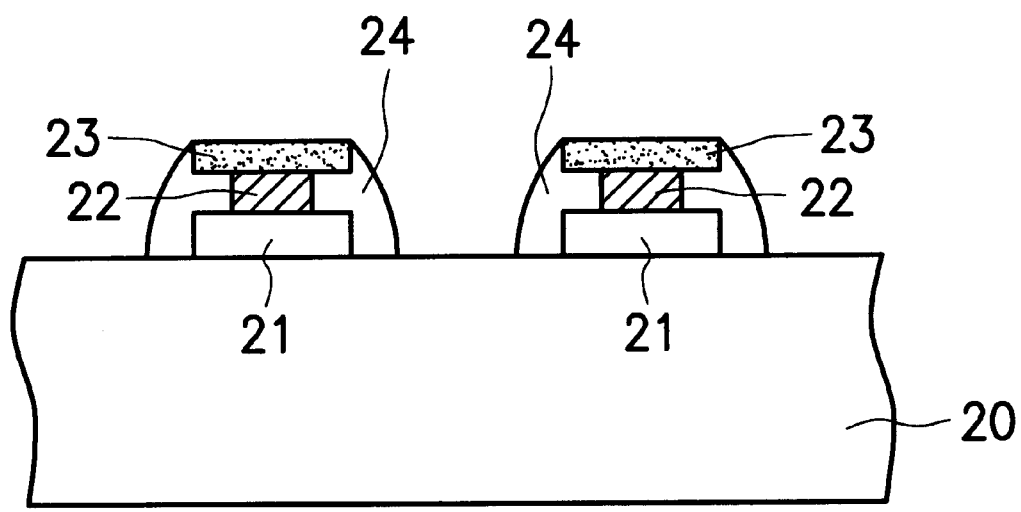

Referring next to FIG. 2B, an etching process is performed on the wafer by using a suitable etchant, such as the RCA agent. The etchant is such that it can effect a fast etching rate on the silicide layer 22 but a slow etching rate on both the overlying silicon nitride layer 23 and the underlying polysilicon layer 21. In the case of the silicide layer 22 being $WSi_2$, the etchant can be, for example, a mixture of $NH_4OH$ and $H_2O_2$. This etchant can etch into $WSi_2$ but not into polysilicon and silicon nitride. Therefore, as illustrated in FIG. 2B, the etching process using this etchant will cause the silicide layer 22 to be constricted, while leaving the polysilicon layer 21 and silicon nitride layer 23 substantially intact. After this, a sidewall spacer 24 is formed on the sidewall of each gate structure by first depositing a dielectric layer, such as an oxide layer, over the wafer, and then performing an anisotropic dray etching process on the dielectric layer.

Figure 2C:
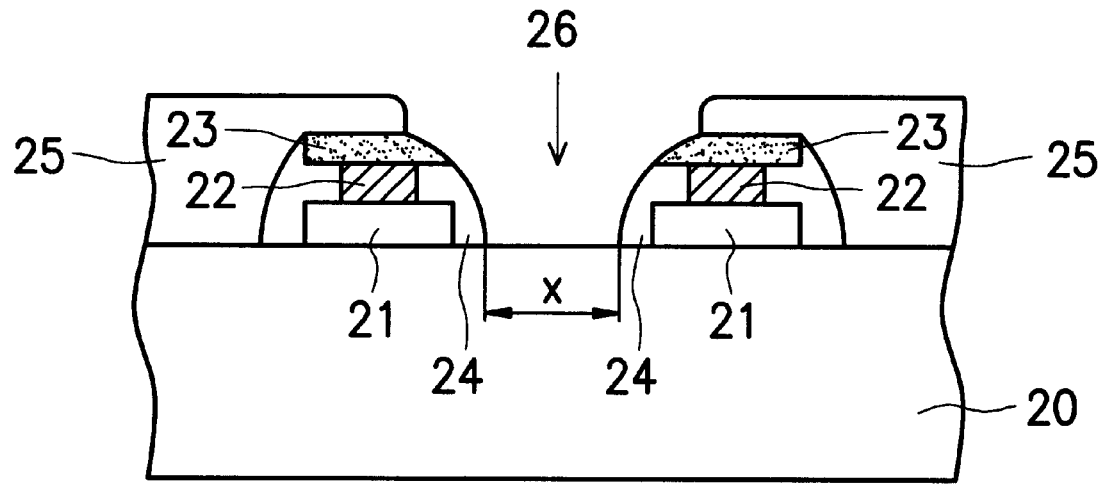

Referring further to FIG. 2C, in the subsequent step, a dielectric layer 25 (inter layer dielectrics) is deposited over the entire top surface of the wafer, covering all of the gate structures and the exposed surfaces of the substrate 20. After this, a photolithographic and etching process is performed on the wafer so as to remove selected portions of the dielectric layer 25 between the gate structures. It is to be noted that, in this photolithographic and etching process, the mask openings are large in dimensions than the contact area (indicated by the width X) that is to be formed on the substrate 20. The etching process continues until the top surface of the substrate 20 is exposed, whereby a contact window 26 having a tapered cross section is formed. As illustrated in FIG. 2C, the resultant contact window 26 has a bottom width of X (i.e., the width of the exposed surface of the substrate 20) which is smaller than its top width.

Figure 2D:
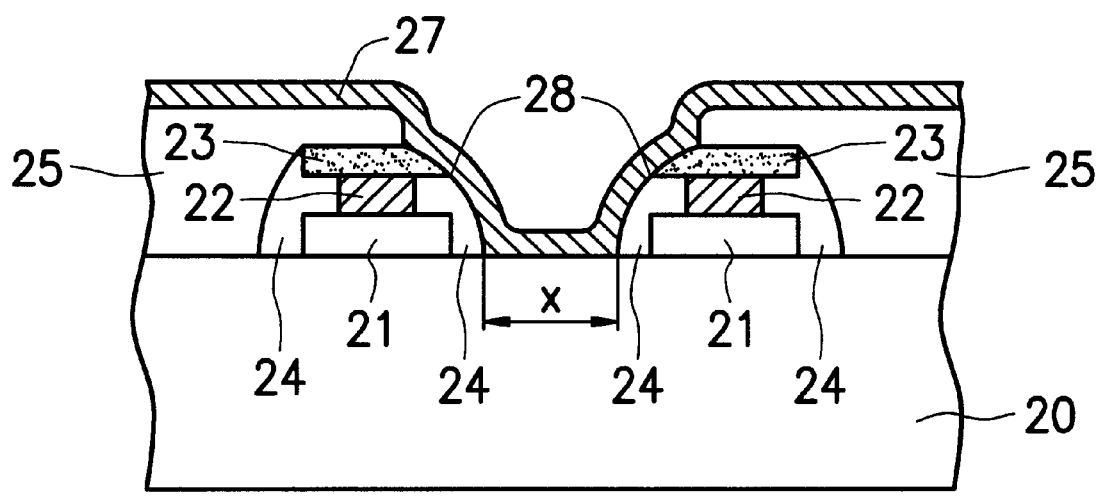

Referring further to FIG. 2D, in the subsequent step, a metallization layer 27 is deposited over the wafer to a specific thickness covering the exposed surfaces of the dielectric layer 25, the sidewall spacers 24 of the gate structures, and the exposed surfaces of the substrate 20. A metal contact having a width X is thus formed between the metallization layer 27 and the substrate 20.

From the foregoing description, it can be seen that, since the silicide layer 22 is constricted with respect to the overlying silicon nitride layer 23 and the underlying polysilicon layer 21 through the use of the RCA agent in the etching process, it can be further separated away from the point 28 where it might otherwise come into contact with the metallization layer 27. As a result, the subsequently formed metallization layer 27 would hardly come into contact with the silicide layer 22 that would cause a short-circuit therebetween. Moreover, since the silicide layer 22 is constricted to a smaller size, the underlying polysilicon layer 21 can also be downsized, allowing the width X of the contact area to be increased compared to the prior art. The increased contact area allows an increase in the RC value of the resultant self-aligned contact.

In conclusion, the invention is characterized in the use of the RCA agent in the etching process, which allows the tungsten silicide layer to be subjected to a faster etching rate in the etching process, thereby being constricted in shape with respect to the overlying silicon nitride layer and underlying polysilicon layer. The constricted shape can prevent the tungsten silicide layer from coming into contact, and thus forming a short-circuit, with the subsequently formed metallization layer.

Moreover, since the silicide layer is reduced in size, the underlying polysilicon layer can also be made smaller, allowing the contact area to be increased. The increased contact area allows an increase in the RC value of the self-aligned contact. In addition, it allows for an increased tolerance in the forming of the self-aligned contact and thus a decreased degree of difficulty in the fabrication. The good yield rate of MOS devices can thus be increased.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming a self-aligned contact in a semiconductor device, comprising the steps of:

(1) preparing a semiconductor substrate, and then forming at least a pair of separate gate structures over said substrate, each gate structure including a first conductive layer formed on said substrate, a second conductive layer formed on said first conductive layer, and an insulating layer formed on said second conductive layer;

(2) performing an etching process with an etchant that etches into the second conductive layer more effectively than into the overlying insulating layer and the underlying first conductive layer;

(3) forming a sidewall spacer on the sidewall of each gate structure;

(4) forming a dielectric layer which covers all of the gate structures and the exposed surfaces of the substrate;

(5) removing away selected portions of the dielectric layer between the gate structures until the surface of the substrate is exposed so as to form a self-aligned contact window; and (6) forming a metallization layer which covers the exposed surface of the dielectric layer, the sidewall spacers of the gate structures, and the exposed surface of the substrate, with the self-aligned contact being formed at the exposed surface of the substrate between the metallization layer and the substrate.

2. The method of claim 1, wherein in said step (1), each gate structure is formed by the steps of:
(i) depositing a layer of a first conductive material over the entire top surface of the substrate;
(ii) depositing a layer of a second conductive material over the entire top surface of the layer of the first conductive material;
(iii) depositing a layer of an insulating material over the entire top surface of the layer of the second conductive material; and
(iv) performing a photolithographic and etching process to remove selected portions of the layers of the first conductive material, the second conductive material, and the insulating material, the remaining portions serving as the gate structures.

3. The method of claim 2, wherein the first conductive material is polysilicon, the second conductive material is a silicide, and the insulating layer is silicon nitride.

4. The method of claim 3, wherein the silicide is tungsten silicide.

5. The method of claim 1, wherein said step (5) is carried out through a photolithographic and etching process.

6. The method of claim 1, wherein in said step (2), the etchant is an RCA agent.

7. The method of claim 1, wherein in said step (2), the etchant is such that it can etch into the first conductive layer, the second conductive layer, and the insulating layer in such a manner that the etching rate on the second conductive layer is faster than the etching rate on both the first conductive layer and the insulating layer.

8. The method of claim 3, wherein the etchant is such that it can-etch into the polysilicon layer, the silicide layer, and the silicon nitride layer in such a manner that the etching rate on the silicide layer is faster than the etching rate on both the polysilicon layer and the silicon nitride layer.

9. The method of claim 4, wherein the etchant is a mixture of $NH_4OH$ and $H_2O_2$.

10. A method for forming a self-aligned contact in a semiconductor device, comprising the steps of:
(1) preparing a semiconductor substrate, and then forming at least a pair of separate gate structures over said substrate, each gate structure including a polysilicon layer formed on said substrate, a silicide layer formed on said polysilicon layer, and a silicon nitride layer formed on said silicide layer;
(2) performing an etching process with an etchant that etches into the silicide layer more effectively than into the overlying silicon nitride layer and the underlying polysilicon layer;
(3) forming a sidewall spacer on the sidewall of each gate structure;
(4) forming a dielectric layer which covers all of the gate structures;
(5) performing a photolithographic and etching process so as to etch away selected portions of the dielectric layer between the gate structures until the surface of the substrate is exposed to thereby form a self-aligned contact window; and
(6) forming a metallization layer which covers the exposed surface of the dielectric layer, the sidewall spacers of the gate structures, and the exposed surface of the substrate, with the self-aligned contact being formed at the exposed surface of the substrate between the metallization layer and the substrate.

11. The method of claim 10, wherein in said step (1), the silicide layer is a layer of tungsten silicide.

12. The method of claim 11, wherein in said step (1), each gate structure is formed by the steps of:
(i) depositing a layer of polysilicon over the entire top surface of the substrate;
(ii) depositing a layer of tungsten silicide over the entire top surface of the layer of the polysilicon layer;
(iii) depositing a layer of silicon nitride over the entire top surface of the tungsten silicide layer; and
(iv) performing a photolithographic and etching process to remove selected portions of the layers of polysilicon, tungsten silicide, and silicon nitride, the remaining portions serving as the gate structures.

13. The method of claim 10, wherein in said step (2), the etchant is an RCA agent.

14. The method of claim 10, wherein in said step (2), the etchant is such that it can etch into the polysilicon layer, the silicide layer, and the silicon nitride layer in such a manner that the etching rate on the silicide layer is faster than the etching rate on both the silicon nitride layer and polysilicon layer.

15. The method of claim 11, wherein in said step (2), the etchant is such that it can etch into the polysilicon layer, the tungsten silicide layer, and the silicon nitride layer in such a manner that the etching rate on the tungsten silicide layer is faster than the etching rate on both the silicon nitride layer and polysilicon layer.

16. The method of claim 13, wherein the etchant is a mixture of $NH_4OH$ and $H_2O_2$.

17. A method for forming a self-aligned contact in a semiconductor device, comprising the steps of:
(1) preparing a semiconductor substrate;
(2) depositing a layer of polysilicon over the entire top surface of the substrate;
(3) depositing a layer of tungsten silicide over the entire top surface of the polysilicon layer;
(4) depositing a layer of silicon nitride over the entire top surface of the tungsten silicide layer;
(5) performing a photolithographic and etching process to remove selected portions of the layers of polysilicon, tungsten silicide, and silicon nitride, the remaining portions serving as a plurality of gate structures;
(6) performing an etching process with an etchant of a mixture of $NH_4OH$ and $H_2O_2$ which etches the layers of polysilicon, tungsten silicide, and silicon nitride in said gate structures in such a manner as to constrict the tungsten silicide layer with respect to the overlying silicon nitride layer and the underlying polysilicon layer;
(7) forming a dielectric layer which covers the gate structures;
(8) performing an anisotropic dry etching process on the dielectric layer to thereby form a sidewall spacer on the sidewall of each gate structure;
(9) forming a dielectric layer which covers all of the gate structures and exposed surfaces of the substrate;
(10) performing a photolithographic and etching process so as to etch away selected portions of the dielectric layer between the gate structures until the surface of the substrate is exposed to thereby form a self-aligned contact window; and

(11) forming a metallization layer which covers the exposed surface of the dielectric layer, the sidewall spacers of the gate structures, and the exposed surface of the substrate, with the self-aligned contact being formed at the exposed surface of the substrate between the metallization layer and the substrate.

* * * * *